(12) United States Patent
Baker et al.

(10) Patent No.: US 8,907,365 B2
(45) Date of Patent: Dec. 9, 2014

(54) OLEDS COMPRISING LIGHT EXTRACTION SUBSTRUCTURES AND DISPLAY DEVICES INCORPORATING THE SAME

(71) Applicant: Corning Incorporated, Corning, NY (US)

(72) Inventors: David Eugene Baker, Bath, NY (US); Daniel Aloysius Nolan, Corning, NY (US); Mark Alejandro Quesada, Horseheads, NY (US); Wageesha Senaratne, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/041,359

(22) Filed: Sep. 30, 2013

(65) Prior Publication Data

US 2014/0091292 A1    Apr. 3, 2014

Related U.S. Application Data

(60) Provisional application No. 61/708,196, filed on Oct. 1, 2012.

(51) Int. Cl.
*H01L 51/52*    (2006.01)
*H01L 51/56*    (2006.01)

(52) U.S. Cl.
CPC ........ *H01L 51/5275* (2013.01); *H01L 51/5262* (2013.01); *H01L 51/56* (2013.01); *H01L 51/5268* (2013.01); *H01L 51/5271* (2013.01)
USPC ................................. 257/98; 257/40; 438/27

(58) Field of Classification Search
CPC ............ H01L 51/5262; H01L 51/5268; H01L 51/5271; H01L 51/5275
USPC ......................................... 257/40, 98; 438/27
See application file for complete search history.

(56) References Cited

U.S. PATENT DOCUMENTS

| | | | |
|---|---|---|---|
| 5,513,288 A | 4/1996 | Mayer | 385/30 |
| 5,703,980 A | 12/1997 | MacElwee et al. | 385/49 |

(Continued)

OTHER PUBLICATIONS

Chang, C. H.; Chang, K. Y.; Lo, Y. J.; Chang, S. J.; Chang, H. H., Fourfold power efficiency improvement in organic light-emitting devices using an embedded nanocomposite scattering layer, Organic Electronics, 2012, vol. 12, Issue 6, pp. 1073-1080, Pub online Mar. 12, 2012.

(Continued)

*Primary Examiner* — Allan R Wilson
(74) *Attorney, Agent, or Firm* — Jason A. Barron

(57) ABSTRACT

An organic light emitting diode comprising a light extraction substructure and a diode superstructure is provided. The light extraction substructure comprises a light expulsion matrix distributed over discrete light extraction waveguide elements and a waveguide surface of the glass substrate. The light expulsion matrix is distributed at varying thicknesses to enhance the planarity of a diode superstructure-engaging side of the light extraction substructure and to provide light expulsion sites at the waveguide element termination points of the discrete light extraction waveguide elements. In operation, light originating in the organic light emitting semiconductor material of the diode superstructure is coupled to the discrete waveguide elements of the light extraction substructure as respective coupled modes characterized by an approximate coupling length defined as the propagation distance required for an optical mode to be coupled from the superstructure waveguide to one of the discrete waveguide elements of the light extraction substructure.

28 Claims, 4 Drawing Sheets

(56) References Cited

U.S. PATENT DOCUMENTS

| | | | |
|---|---|---|---|
| 5,994,835 A | 11/1999 | Wilson et al. | 313/504 |
| 6,392,338 B1 | 5/2002 | Hori et al. | 313/504 |
| 6,586,876 B2 | 7/2003 | Tsai et al. | 313/509 |
| 6,600,847 B2 | 7/2003 | Saini et al. | 385/14 |
| 6,985,275 B2 | 1/2006 | Miyazawa | 359/245 |
| 7,302,124 B2 | 11/2007 | Forrest et al. | 385/14 |
| 7,432,649 B2 | 10/2008 | West | 313/506 |
| 7,462,984 B2 | 12/2008 | Handa et al. | 313/503 |
| 7,508,130 B2 | 3/2009 | Cok | 313/512 |
| 7,535,166 B2* | 5/2009 | Okutani | 313/504 |
| 7,594,839 B2 | 9/2009 | Cok et al. | 445/24 |
| 7,824,541 B2 | 11/2010 | Bhan | 208/244 |
| 7,834,539 B2 | 11/2010 | Handa et al. | 313/503 |
| 7,834,541 B2 | 11/2010 | Cok | 313/504 |
| 7,872,414 B2 | 1/2011 | Sugita et al. | 313/506 |
| 7,888,144 B2 | 2/2011 | Chiu et al. | 438/22 |
| 7,957,621 B2 | 6/2011 | Zhang et al. | 385/131 |
| 8,269,214 B2* | 9/2012 | Smigelski et al. | 257/40 |
| 8,405,063 B2* | 3/2013 | Kazlas et al. | 257/9 |
| 8,431,943 B2* | 4/2013 | Nakamura et al. | 257/98 |
| 2006/0186801 A1 | 8/2006 | West | 313/506 |
| 2006/0250084 A1 | 11/2006 | Cok et al. | 313/512 |
| 2007/0126352 A1* | 6/2007 | Okutani | 313/506 |
| 2007/0126353 A1* | 6/2007 | Kubota et al. | 313/506 |
| 2007/0126358 A1* | 6/2007 | Okutani et al. | 313/512 |
| 2007/0252155 A1 | 11/2007 | Cok | 257/79 |
| 2010/0090234 A1* | 4/2010 | Cho et al. | 257/95 |
| 2010/0182222 A1 | 7/2010 | Ichihashi et al. | 345/76 |
| 2010/0283075 A1* | 11/2010 | McKenzie et al. | 257/98 |
| 2012/0025172 A1* | 2/2012 | Smigelski et al. | 257/40 |
| 2012/0098421 A1 | 4/2012 | Thompson | 313/512 |
| 2012/0112225 A1 | 5/2012 | Le Bellac et al. | 257/98 |
| 2012/0155093 A1 | 6/2012 | Yamada et al. | 362/311.01 |

OTHER PUBLICATIONS

Chen, S.; Qin, W.; Zhao, Z.; Tang, B. Z.; Kwok, H. S., One-step fabrication of organic nanoparticles as scattering media for extracting substrate waveguide light from organic light-emitting diodes, Journal of Materials Chemistry, 2012, vol. 22, Issue 26, pp. 13386-13390.

Cho, S. H.; Song, Y. W.; Lee, J. G.; Kim, Y. C.; Lee, J. H.; Ha, J.; Oh, J. S.; Lee, S. Y.; Lee, S. Y.; Hwang, K. H.; Zang, D. S.; Lee, Y. H., Weak-microcavity organic light-emitting diodes with improved light out-coupling, Optics Express, 2008, vol. 16, No. 17, pp. 12632-12639, Aug. 6, 2008.

Ee, Y. K.; Kumnorkaew, P.; Arif, R. A.; Tong, H.; Zhao, H.; Gilchrist, J. F.; Tansu, N., Optimization of Light Extraction Efficiency of III-Nitride LEDs With Self-Assembled Colloidal-Based Microlenses, IEEE Journal of Selected Topics in Quantum Electronics, 2009, vol. 15, No. 4, pp. 1218-1225.

Mont, F. W.; Kim, J. K.; Schubert, M. F.; Schubert, E. F.; Siegel, R. W., High-refractive-index TiO2-nanoparticle-loaded encapsulants for light-emitting diodes, Journal of Applied Physics, 2008, vol. 103, No. 8, 6 pages, Online Apr. 25, 2008.

Ohmori, Y.; Ueta, H.; Hikita, M.; Yoshino, K., Organic light emitting diode directly fabricated on a polymer waveguide device, Materials Research Society Symposium Proceedings, 2000, vol. 597; pp. 103-108.

Ohmori, Y.; Kajii, H.; Kaneko, M.; Yoshino, K.; Ozaki, M.; Fujii, A.; Hikita, M.; Takenaka, H.; Taneda, T., Realization of Polymeric Optical Integrated Devices Utilizing Organic Light-Emitting Diodes and Photodetectors Fabricated on a Polymeric Waveguide, IEEE Journal of Selected Topics in Quantum Electronics, 2004, vol. 10, No. 1, pp. 70-78.

Oulton, R. F.; Adjiman, C. S.; Handa, K.; Aramaki, S., Efficiency enhancement of organic based Lighht Emitting Diodes using a scattering layer, Physics Optics http://arXiv.org/abs/physics/0411095v1, pp. 1-8, Nov. 9, 2004.

Ramuz, M.; Burgi, L.; Stanley, R.; Witmewisser, C., Coupling light from an organic light emitting diode (OLED) into a single-mode waveguide: Toward monolithically integrated optical sensors, Journal of Applied Physics, 2009, vol. 105; No. 8, 8 pages.

Tsutsui, T.; Yahiro, M.; Yokogawa, H.; Kawano, K.; Yokoyama, M., Doubling Coupling-Out Efficiency in Organic Light-Emitting Devices Using a Thin Silica Aerogel Layer, Advanced Materials, 2001, vol. 13, No. 15, p. 1149-1150, Aug. 3, 2001, Pub online Apr. 22, 2009.

* cited by examiner

Fig. 6
Fig. 6A
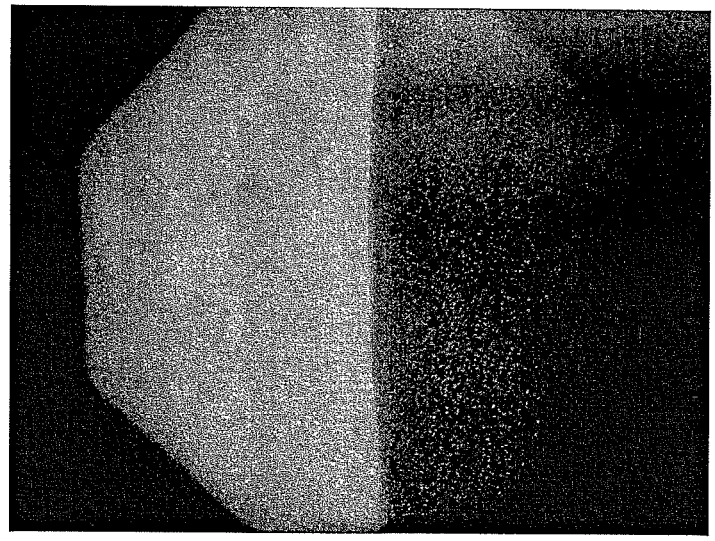
Fig. 6B
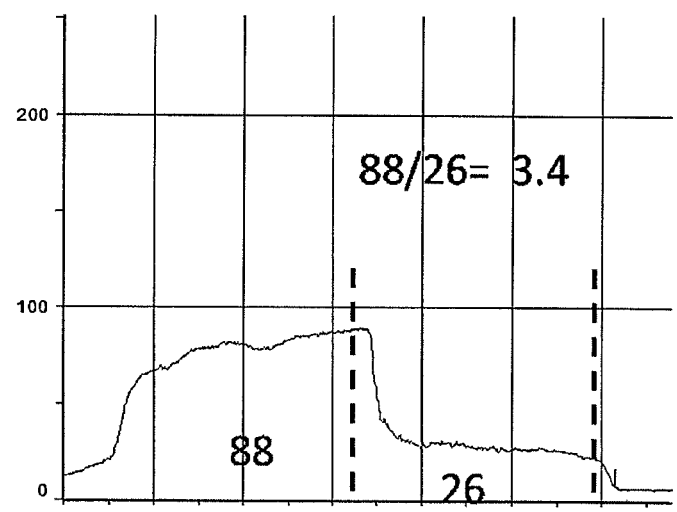

Fig. 7
Fig. 7A
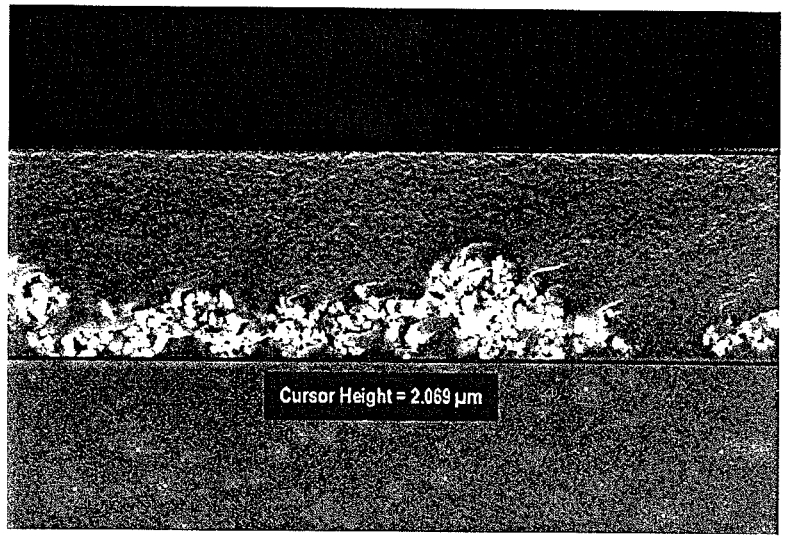
Fig. 7B
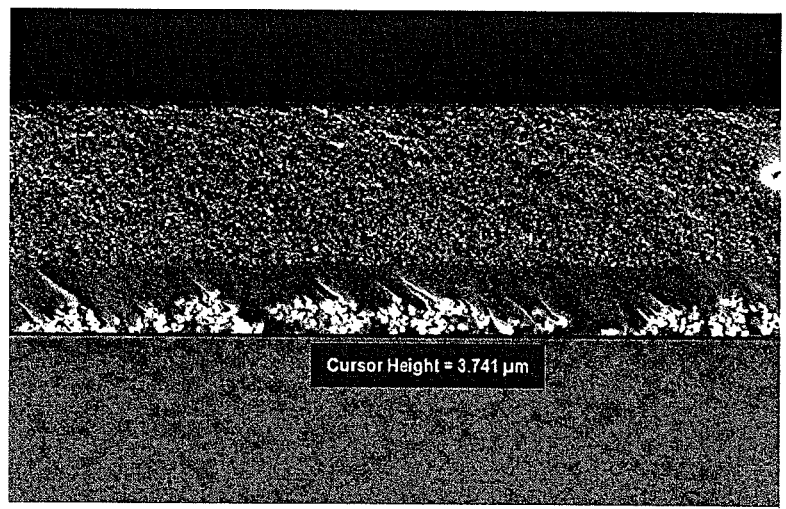

OLEDS COMPRISING LIGHT EXTRACTION SUBSTRUCTURES AND DISPLAY DEVICES INCORPORATING THE SAME

CROSS-REFERENCE TO RELATED APPLICATIONS

This application claims the benefit of priority under 35 U.S.C. §119 of U.S. Provisional Application Ser. No. 61/708,196, filed on Oct. 1, 2012, the content of which is relied upon and incorporated herein by reference in its entirety.

FIELD

The present disclosure relates to organic light emitting diodes (OLEDs) and display devices incorporating the same. For example, contemplated display devices include, but are not limited to, light sources, image displays, visual indicators, or any other device that utilizes one or more light sources to fulfill its function.

BACKGROUND

Organic light emitting diodes (OLEDs) are generally attractive for display applications. A variety of OLED configurations have been proposed to increase the operating efficiency and enhance other performance parameters of OLEDs including, for example, those proposed in U.S. Pat. Nos. 7,834,539, 7,824,541, and 7,432,649 and published U.S. Pre-Grant Publications 2012/0155093, 2012/0112225, and 2007/0252155. A continual challenge in the area of LEDs, and OLEDs in particular, is optimizing light extraction from the device. The technology of the present disclosure is introduced as a way of enhancing OLED performance via novel light extraction systems.

BRIEF SUMMARY

The present inventors have recognized that, although light can be efficiently generated in OLED devices, much of the generated light remains trapped in the device. In fact, in many devices, only approximately 25% of the generated light escapes to the environment, leaving approximately 45% trapped in the organic material of the device and approximately 30% trapped in the glass layer of the device. According to the subject matter of the present disclosure, a light extraction substructure is provided that enhances light extraction from the organic material of the OLED device and reduces entrapment within the glass layer of the device. The proposed substructure may incorporate chemically strengthened glass such as, for example, ion-exchanged glass. In addition, the glass of the proposed substructure can be manufactured in high volumes using, for example, a fusion draw process.

In one embodiment of the present disclosure, an organic light emitting diode comprising a light extraction substructure and a diode superstructure is provided. The light extraction substructure comprises a glass substrate, a plurality of discrete light extraction waveguide elements distributed over a waveguide surface of the glass substrate, and a light expulsion matrix distributed over the discrete light extraction waveguide elements and the waveguide surface of the glass substrate. The discrete light extraction waveguide elements extend between waveguide element termination points. The light expulsion matrix is distributed at varying thicknesses to enhance the planarity of a diode superstructure-engaging side of the light extraction substructure and to provide light expulsion sites at the waveguide element termination points of the discrete light extraction waveguide elements. The superstructure waveguide and the light extraction substructure are configured such that, in operation, light originating in the organic light emitting semiconductor material of the diode superstructure is coupled to the discrete waveguide elements of the light extraction substructure as respective coupled modes characterized by an approximate coupling length, $L_C$, defined as the propagation distance required for an optical mode to be coupled from the superstructure waveguide to one of the discrete waveguide elements of the light extraction substructure. The discrete light extraction waveguide elements, or at least a majority thereof, have a length, $L_T$, from about $L_C \leq L_T \leq 5L_C$.

In another embodiment of the present disclosure, an organic light emitting diode is provided where a majority of the discrete light extraction waveguide elements extend less than approximately 20 μm between waveguide element termination points along a direction of optical propagation defined by the superstructure waveguide. The index of refraction of the light expulsion matrix η(P) is at least approximately 0.2 less than the effective index of refraction of the superstructure waveguide $\eta_{eff}(O)$ and the effective index of refraction of the discrete light extraction waveguide elements $\eta_{eff}(WG)$. In addition, the respective effective indices of refraction of the superstructure waveguide $\eta_{eff}(O)$ and the discrete light extraction waveguide elements $\eta_{eff}(WG)$ differ by approximately 0.2 or less. Further, the thickness of the superstructure waveguide x(O) and the combined thickness x(WG+P) of the discrete light extraction waveguide elements and the light expulsion matrix differ by less than approximately 1.5 μm and the superstructure waveguide is separated from the discrete light extraction waveguide elements by less than approximately 1.5 μm.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals.

FIG. 6 shows intensity obtained for the device (FIG. 6A) fabricated according to the schematic of FIG. 1 but without the smoothing or planarization layer. Left side of the device contains the nanoparticles on the OLED and the right side contains only the OLED. The intensity difference is shown on the graph (FIG. 6B) where the increased intensity (3.4×) in the presence of the scattering sites.

FIG. 7 shows SEMS of a glass with a scattering layers and planarization layer/s. FIG. 7A shows a ~2 μm thickness total and FIG. 7B shows a 3.7 μm thickness. In both pictures, the scattering layer shows up as the white particles at the lower interface and the planarizing layer is the roughened surface above the scattering layer.

DETAILED DESCRIPTION

Figure 1:
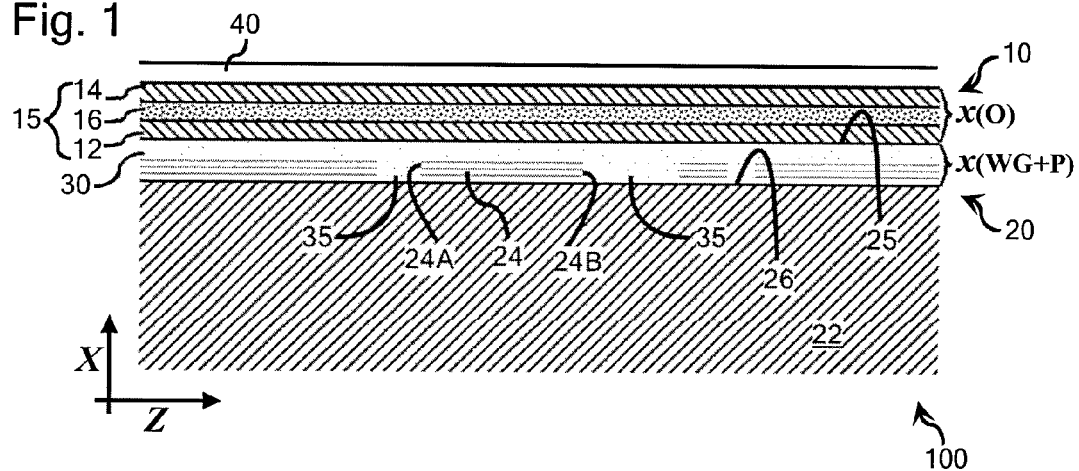
FIG. 1 is a schematic illustration of the layered structure of an OLED according to one embodiment of the present disclosure.

FIG. 1 is a schematic illustration of the layered structure of an OLED 100 according to one embodiment of the present disclosure. The illustrated organic light emitting diode 100 comprises a diode superstructure 10 and a light extraction substructure 20. The diode superstructure 10 comprises an anode 12, a cathode 14, and an organic light emitting semiconductor material 16 interposed between the anode 12 and the cathode 14 to collectively define a superstructure waveguide 15. The light extraction substructure 20 comprises a glass substrate 22, a plurality of discrete light extraction waveguide elements, $L_T$, 24 distributed over a waveguide surface 26 of the glass substrate 22, and a light expulsion matrix 30 distributed over the discrete light extraction waveguide elements 24 and the waveguide surface 26 of the glass substrate 22. The OLED 100 may further comprise an encapsulating layer 40.

Figure 2:
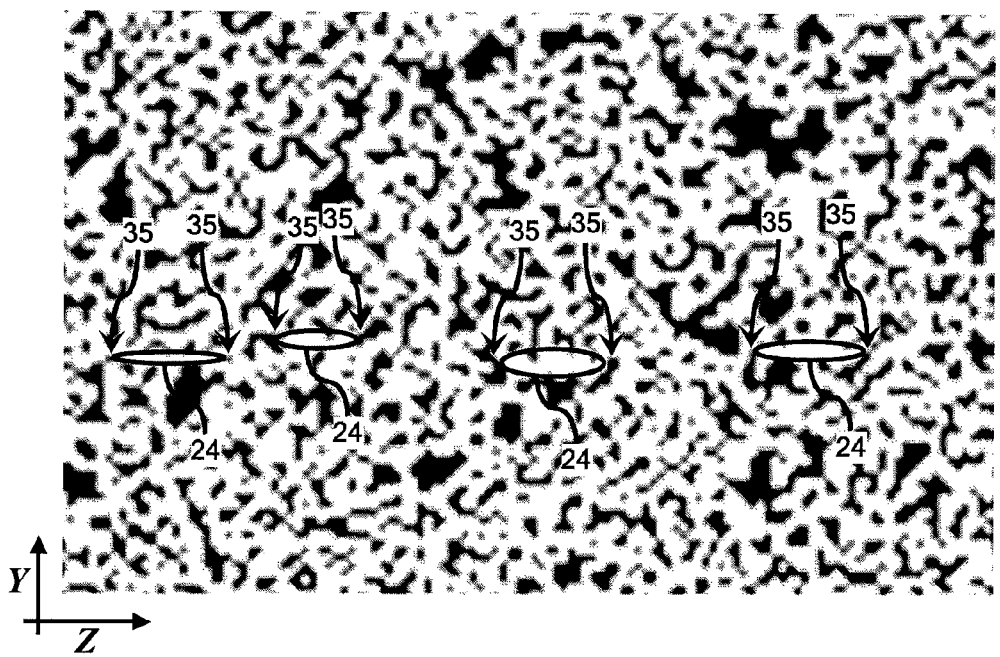
FIG. 2 represents an image of an approximately 30 μm by 20 μm surface portion of a light extraction substructure taken with a scanning electron microscope.
Figure 3:
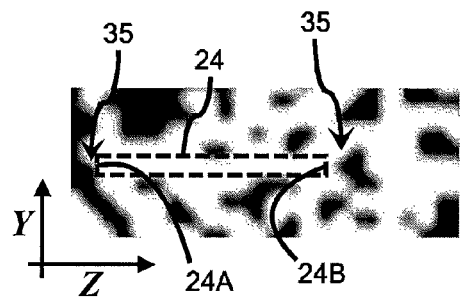
FIG. 3 illustrates a portion of the surface image of FIG. 2.

FIG. 2 represents an image of an approximately 30 μm by 20 μm surface portion of a contemplated light extraction substructure 20 taken with a scanning electron microscope and FIG. 3 illustrates a portion of the surface image of FIG. 2 in expanded detail. As is illustrated in FIGS. 1-3, the discrete light extraction waveguide elements, $L_T$, 24 extend between waveguide element termination points 24A, 24B along a direction of optical propagation that runs generally along the Z-axis, as defined by the superstructure waveguide 15. In some cases, the total amount of space occupied by the light extraction waveguide elements in the area defined by Y and Z may be from about 35% to about 65%—i.e., the surface area as shown in FIG. 2 would comprise about 35-65% light extraction waveguide elements.

The light expulsion matrix 30 is distributed at varying thicknesses to enhance the planarity of a diode superstructure-engaging side 25 of the light extraction substructure 20 and to provide light expulsion sites 35 at the waveguide element termination points 24A, 24B of the discrete light extraction waveguide elements 24, from which coupled light can be scattered to the environment.

The superstructure waveguide 15 and the light extraction substructure 20 are configured such that, in operation, light originating in the organic light emitting semiconductor material 16 of the diode superstructure 10 is coupled to the discrete waveguide elements, $L_T$, 24 of the light extraction substructure 20 as respective coupled modes characterized by an approximate coupling length, $L_C$, defined as the propagation distance required for an optical mode to be coupled from the superstructure waveguide 15 to one of the discrete waveguide elements 24 of the light extraction substructure 20. The coupling length is determined by the waveguide geometry, waveguide indices, wavelength, and by the mismatch between the effective refractive indices of the coupled waveguide modes, as will be described in further detail herein.

In some embodiments of the present disclosure, it is sufficient to ensure that the linear extent of a majority, or substantially all, of the discrete light extraction waveguide elements, $L_T$, between the waveguide element termination points have a length equivalent to about the coupling length to about five times coupling length, or $L_C \leq L_T \leq 5L_C$. In other embodiments, it is sufficient to ensure that a majority, or substantially all, of the discrete light extraction waveguide elements extend less than approximately 20 μm between the waveguide element termination points 24A, 24B. In either case, the extraction of light from the superstructure waveguide 15 can be greatly enhanced if the discrete waveguide elements 24 are microns or sub-microns, away from the superstructure waveguide 15 and if the light extraction substructure 20 including the discrete waveguide elements 24 presents a similar effective index of refraction and dimensions to that of superstructure waveguide 15.

Referring to FIG. 3, it is contemplated that the discrete light extraction waveguide elements can be separated from the superstructure waveguide by approximately 0.4 μm along a dimension perpendicular to the direction of optical propagation. In which case, the approximate coupling length is typically 10 μm or less and the length of the discrete light extraction waveguide elements 24 between the waveguide element termination points 24A, 24B is approximately 10 μm or less. Where the discrete light extraction waveguide elements 24 are separated from the superstructure waveguide by approximately 0.3 μm, the approximate coupling length is typically 5 μm or less and the length of the discrete light extraction waveguide elements is approximately 5 μm or less. In most cases, a majority, or substantially all, of the discrete light extraction waveguide elements 24 will extend from approximately 1 μm to approximately 20 μm in length between waveguide element termination points 24A, 24B.

FIGS. 2 and 3 illustrate the distribution of the discrete light extraction waveguide elements 24 over the waveguide surface 26 of the glass substrate 22. It may be advantageous if the waveguide elements 24 define a pseudo-random distribution. For the purposes of the present disclosure, it is noted that a pseudo-random distribution is a random distribution that is controlled to the extent sufficient to ensure uniform distribution of the most significant waveguide elements 24, i.e., those elements 24 that are from approximately 1 μm to approximately 20 μm in length.

Figure 4:
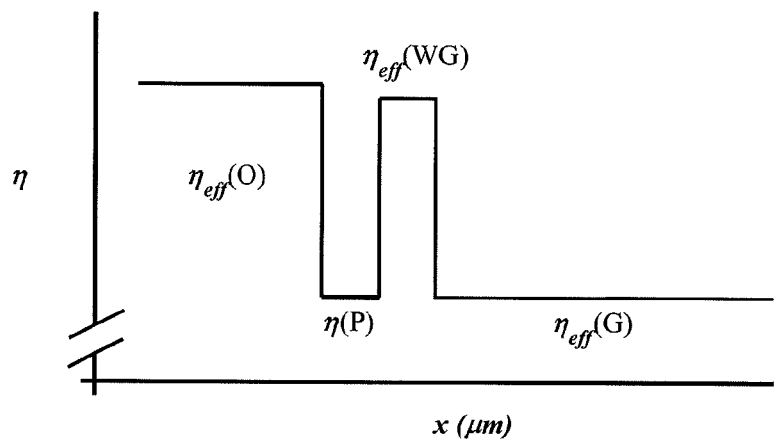
FIG. 4 illustrates a contemplated refractive index profile of an OLED according to the present disclosure.

Referring further to the refractive index profile illustrated schematically in FIG. 4, in some contemplated embodiments, enhanced light extraction can be achieved by ensuring that the index of refraction of the light expulsion matrix η(P) is at least approximately 0.2 less than the effective index of refraction of the superstructure waveguide $η_{eff}(O)$ and the effective index of refraction of the discrete light extraction waveguide elements $η_{eff}(WG)$. It is further preferable to ensure, that the respective effective indices of refraction of the superstructure waveguide $η_{eff}(O)$ and the discrete light extraction waveguide elements $η_{eff}(WG)$ differ by approximately 0.2 or less. In addition, referring to FIG. 1, the thickness of the superstructure waveguide x(O) and the combined thickness x(WG+P) of the discrete light extraction waveguide elements and the light expulsion matrix can be engineered to differ by less than approximately 1.5 μm, or in some embodiments, 1.0 μm, along a dimension perpendicular to the direction of optical propagation, which runs generally along the Z-axis. As is noted above, the superstructure waveguide 15 is often separated from the discrete light extraction waveguide elements 24 by less than approximately 1.5 μm, or in some embodiments, 1.0 μm, along a dimension perpendicular to the direction of optical propagation.

More specifically, it is contemplated that the respective effective indices of refraction of the superstructure waveguide $η_{eff}(O)$ and the discrete light extraction waveguide elements $η_{eff}(WG)$ may differ by approximately 0.2 or less, and in some cases by approximately 0.1 or less, or approximately 0.05 or less, and that the respective indices of refraction of the light expulsion matrix η(P) and the glass substrate η(G) may be approximately equal, may differ by about 0.2 or less, or about 0.1 or less. For example, and not by way of limitation, it is contemplated that the effective index of refraction of the superstructure waveguide $\eta_{eff}(O)$ may be approximately 1.8 and the effective index of refraction of the discrete light extraction waveguide elements $\eta_{eff}(WG)$ may exceed about 1.7, 1.75, 1.8, 1.9, or 2.0.

As a general guide to effective device design, it is contemplated that the effective index of refraction of the superstructure waveguide $\eta_{eff}(O)$, the effective index of refraction of the discrete light extraction waveguide elements $\eta_{eff}(WG)$, the index of refraction of the light expulsion matrix $\eta(P)$, and the index of refraction of the glass substrate $\eta(G)$ may satisfy the following relations:

$$1.6 \geq \eta(P) \geq 1.3$$

$$2.0 \geq \eta_{eff}(O) \geq 1.7$$

$$\eta_{eff}(WG) > 1.7$$

$$1.6 \geq \eta(G) \geq 1.4$$

$$|\eta(P) - \eta(G)| < 0.2$$

$$|\eta_{eff}(O) - \eta_{eff}(WG)| \leq 0.3$$

$$\eta_{eff}(O) - \eta(P) \geq 0.2$$

with the understanding that the following more narrow relations may alternatively apply for further enhancement of light extraction and expulsion:

$$\eta_{eff}(WG) \geq 1.75$$

$$|\eta_{eff}(O) - \eta_{eff}(WG)| \leq 0.2$$

$$\eta_{eff}(O) - \eta(P) \geq 0.25.$$

An alternative embodiment may satisfy the following relations:

$$1.55 \geq \eta(P) \geq 1.45$$

$$1.85 \geq \eta_{eff}(O) \geq 1.75$$

$$\eta_{eff}(WG) > 1.7$$

$$1.55 \geq \eta(G) \geq 1.45$$

$$|\eta(P) - \eta(G)| < 0.1$$

$$|\eta_{eff}(O) - \eta_{eff}(WG)| \leq 0.1$$

$$\eta_{eff}(O) - \eta(P) \geq 0.2$$

with the understanding that the following more narrow relations may alternatively apply for further enhancement of light extraction and expulsion:

$$\eta_{eff}(WG) \geq 1.75$$

$$|\eta_{eff}(O) - \eta_{eff}(WG)| \leq 0.05$$

$$\eta_{eff}(O) - \eta(P) \geq 0.25.$$

As is noted above, the extraction of light from the superstructure waveguide 15 can be greatly enhanced if the discrete waveguide elements 24 are microns or sub-microns, away from the superstructure waveguide 15 and if the light extraction substructure 20 including the discrete waveguide elements 24 presents a similar effective index of refraction and dimensions to that of superstructure waveguide 15. To this end, referring to FIG. 1, it is likely to be preferable to ensure that the combined thickness x(WG+P) of the discrete light extraction waveguide elements 24 and the light expulsion matrix 30 is approximately 1.5 μm or less along a dimension perpendicular to the direction of optical propagation. In some embodiments, it will be preferable to ensure that the separation is approximately 0.5 μm or less. Further, the diode superstructure-engaging side 25 of the light extraction substructure 20 is characterized by an RMS surface roughness of approximately 20 nm or less, which can be accomplished by providing a light expulsion matrix 30 of sufficient thickness. In any case, care should be taken to ensure that the light expulsion matrix 30 is thick enough to enable a smooth interface at the superstructure waveguide boundary, yet thin enough to allow significant tunneling of light from the superstructure waveguide 15 to the discrete waveguide elements 24.

The probability of tunneling from the superstructure waveguide 15 to the discrete waveguide elements 24 is given by $$P = e^{(-2qd)}$$

where $$q = 2\pi\lambda(\eta_1^2 - \eta_{eff}^2)^{-1/2}.$$

For these index values, an effective index of the superstructure mode of 1.65, and a separation of 0.75 μm, the probability of tunneling is on the order of $10^{-8}$, which is very small. However, if a waveguide exists to which light can couple, the coupling length is approximately given by $$[2\pi P(\lambda)/\lambda]^{1/2}.$$

Figure 5:
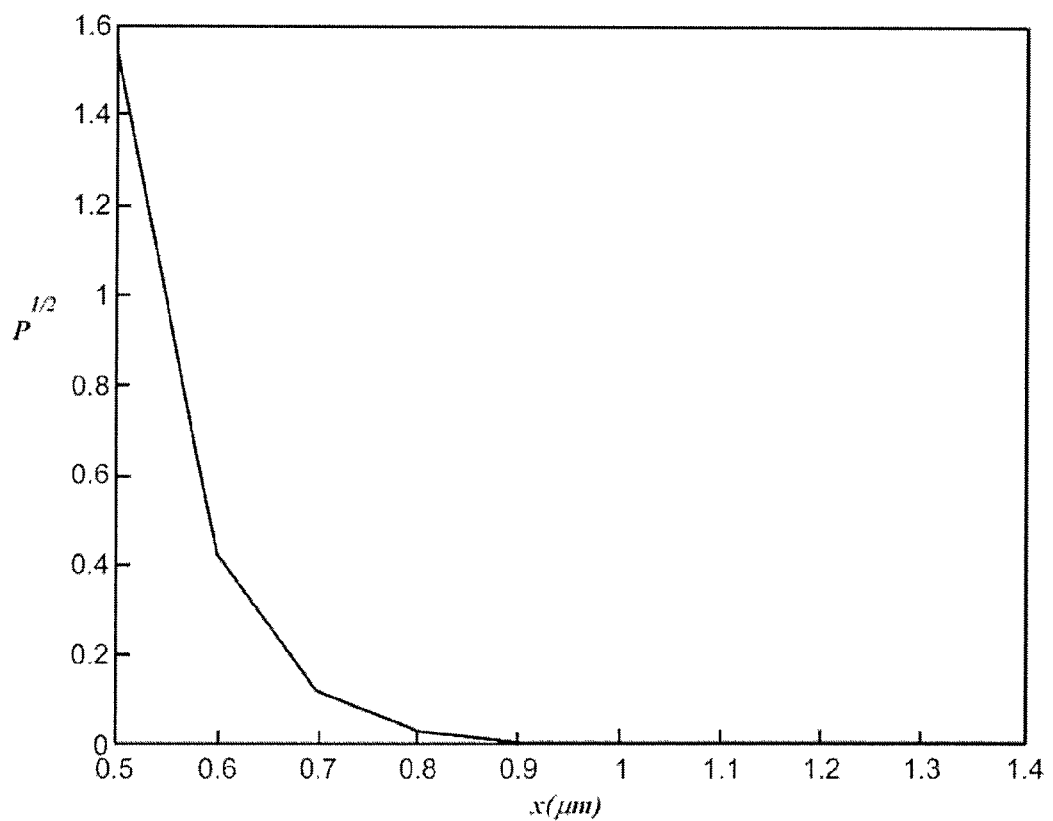
FIG. 5, illustrates the manner in which a separation distance x between the discrete light extraction waveguide elements and the superstructure waveguide affects tunneling amplitude in a contemplated OLED according to the present disclosure.

FIG. 5 is a plot of $P^{1/2}$ as a function of guide separation, a parameter that is directly proportional to the coupling length. It is important to note that if the waveguide parameters of the guides are not matched, the coupling between guides is exponentially decreased. This fractional decrease is given by $$C^2/(C^2 + (\Delta\beta/2)^2).$$

Since C is typically a small number, e.g., $10^{-3}$ or $10^{-4}$, the difference in effective index of the guides must be relatively small since $$\Delta\beta = (2\pi/\lambda)\lambda neff$$

Where Δneff is the difference in effective indices of the guides.

Referring to FIG. 1, the specific materials selected for the anode 12, cathode 14, and organic light emitting semiconductor material 16 of the diode superstructure 10 are beyond the scope of the present disclosure and may be gleaned from conventional and yet to be developed teachings on the subject. It is noted, however, that the anode 12 is a transparent conductive oxide, like indium tin oxide (ITO), that is transparent to light emitted by the organic light emitting semiconductor material 16 and provides a suitable interface with the diode superstructure-engaging side 25 of the light extraction substructure 20. Further, while the cathode may comprise any conductive material that has the appropriate work function to match the light emitting material. For example, the cathode may comprise Ag, Au, Al, SM, Tm, Yb or bimetallic materials, such as Ca:Al, Eu:Yb, or Tm:Yb. The thickness of the cathode may be in the range of about 70-400 nm, about 70-300 nm, or about 70-200 nm. In some cases, when the cathode material thickness is below 70 nm, the device may become bi-directional as light can escape from the cathode as well. This may be advantageous under certain circumstances where additional components are used to harvest the light escaping from the cathode Therefore, some embodiments may comprise a cathode having a thickness of from about 10 nm to about 70 nm, less than about 70 nm, or a thickness such that more than greater than 1% of the light emitted from the OLED is emitted through the cathode.

It is noted that the thickness of the superstructure waveguide x(O) is approximately 1.0 µm or less or, in some cases, approximately 0.5 µm or less.

Similarly, the specific materials selected for the glass substrate may also be gleaned from conventional and yet to be developed teachings on the subject. It is noted, however, that the concepts of the present disclosure are well suited for a variety of types of glass including, for example, glasses manufactured in high volumes using, for example, a fusion draw process, and chemically strengthened, ion-exchanged glasses.

For the discrete waveguide elements 24, care should be taken to ensure that material selection enables the various parameters and characteristics described herein. For example, and not by way of limitation, it is contemplated that the discrete waveguide elements 24 may comprise titania and a binder collectively forming a titania agglomerate. Alternatively, it is contemplated that the waveguide elements 24 may comprise titania, zirconia, alumina, tin oxide, zinc oxide, or combinations thereof. The binder can be surfactant (typically <1 wt %; <0.05 wt %) and may be non-ionic and non-reactive and should not affect the charge of the inorganic oxide nanoparticles. The binder may also be selected to provide good dispersant property to the nanoparticle solution and may lower the surface tension of the aqueous nanoparticle solution (~34 dyne/cm at 25° C.) providing dip-coatable solution with uniformity. For example, and not by way of limitation, non-ionic surfactants selected from surfactants similar to Tergitol™ which is a non-ionic surfactant available from The Dow Chemical Company. It is also contemplated that suitable binders may include, for example, surfactants similar to Pluronics P123®, which is a difunctional block copolymer surfactant that terminates in primary hydroxyl groups, and is available from BASF Corporation.

Coating methods to produce the waveguide elements and/or layer include those methods know in the art that will produce a surface with desired properties, wherein waveguide element concentration and dispersant concentrations may be varied to provide the necessary concentration of waveguide elements in the end product. Such methods include, but are not limited to, dip coating, spin coating, screen printing, ink jet coating, spraying, vapor or particle deposition, roller coating or roll-to-roll processing, etc.

The light expulsion material of the light expulsion matrix 30 can also be considered a binder and a smoothening/planarizing layer and may have a refractive index substantially similar to the refractive index of the glass substrate 22. For example, the light expulsion material may be provided as a "spin on glass." The light expulsion matrix 30 may be characterized by relatively high crack resistance (low shrinkage after cure), may have the ability to fill nanoscale gaps, and may generally be thermally stable. In general, the light expulsion matrix is thermally stable up to approximately 250-300° C. in air. Beyond this temperature, the matrix materials may become thermally unstable and/or break down. By way of example, and not limitation, the light expulsion matrix 30 may be formed from one or more of: partially polymerized polymethylsiloxane (e.g. T-12, 512B, T-11 spin on glass (Honeywell)), poly-dimethyl-siloxane, poly-diphenyl-siloxane, partially polymerized polysilsesquioxane, poly-methyl-silsesquioxane(HardSil™ AM, Gelest Chemicals), and poly-phenyl-silsesquioxane, poly-methyl-phenyl silsesquioxane (HardSil™ AP, Gelest).

EXAMPLES

FIG. 6 shows intensity obtained for the device (FIG. 6A) fabricated according to the schematic of FIG. 1 but without the smoothing or planarization layer. Left side of the device contains the nanoparticles on the OLED and the right side contains only the OLED. The intensity difference is shown on the graph (FIG. 6B) where the increased intensity (3.4×) in the presence of the scattering sites.

FIG. 7 shows SEMS of a glass with a scattering layers and planarization layer/s. FIG. 7A shows a ~2 um thickness total and FIG. 7B shows a 3.7 µm thickness. In both pictures, the scattering layer shows up as the white particles at the lower interface and the planarizing layer is the roughened surface above the scattering layer.

Table 1 shows AFM RMS roughness measurements for the corresponding SEMS shown in FIG. 7A (~2 µm thickness) and FIG. 7B (3.7 µm thickness). Total RMS surface roughness shows a dependence on binder depth as well as agglomerate size.

TABLE 1

| Thickness (SEM, µm) | $R_q$ (nm) | $R_a$ (nm) |
|---|---|---|
| 237:12 | 2.1 | 8.3 | 6.7 |
| 234:12 | 3.7 | 4.3 | 3.4 |

In this disclosure, it is noted that the reference herein to respective "sub" and "super" structures are not intended to limit the claimed OLEDs and OLED devices to any particular orientation. Rather, these terms are merely introduced to provide a convenient way to distinguish between two primary parts of the collective assembly.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. For example, FIG. 1 is merely a schematic illustration of the layered structure of an OLED 100 according to one embodiment of the present disclosure. A variety of OLED configurations are contemplated herein, the structural details of which may be conveniently gleaned from the present description, the accompanying drawings, and the appended claims. FIG. 1 is presented for illustrative purposes and is not intended to create a presumption that each of the various aspects illustrated therein is a necessary part of the various embodiments contemplated herein.

The claims appended hereto should be taken as the sole representation of the breadth of the present disclosure and the corresponding scope of the various embodiments described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present disclosure, it is noted that this term is introduced in the claims as an open-ended transitional phrase that is used to introduce a recitation of a series of characteristics of the structure and should be interpreted in like manner as the more commonly used open-ended preamble term "comprising."

It is also noted that recitations herein of "at least one" component, element, etc., should not be used to create an inference that the alternative use of the articles "a" or "an" should be limited to a single component, element, etc.

It is further noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

In this disclosure, it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

What is claimed is:

1. An organic light emitting diode comprising a light extraction substructure and a diode superstructure, wherein:
    the diode superstructure comprises a cathode, an anode, and an organic light emitting semiconductor material interposed between the cathode and the anode to collectively define a superstructure waveguide;
    the light extraction substructure comprises a glass substrate, a plurality of discrete light extraction waveguide elements distributed over a waveguide surface of the glass substrate, and a light expulsion matrix distributed over the discrete light extraction waveguide elements and the waveguide surface of the glass substrate;
    the discrete light extraction waveguide elements extend between waveguide element termination points along a direction of optical propagation defined by the superstructure waveguide;
    the light expulsion matrix is distributed at varying thicknesses to enhance the planarity of a diode superstructure-engaging side of the light extraction substructure and to provide light expulsion sites at the waveguide element termination points of the discrete light extraction waveguide elements;
    the superstructure waveguide and the light extraction substructure are configured such that, in operation, light originating in the organic light emitting semiconductor material of the diode superstructure is coupled to the discrete waveguide elements of the light extraction substructure as respective coupled modes characterized by an approximate coupling length defined as the propagation distance required for an optical mode to be coupled from the superstructure waveguide to one of the discrete waveguide elements of the light extraction substructure; and
    the linear extent of a majority of the discrete light extraction waveguide elements between the waveguide element termination points does not exceed five times the coupling length.

2. An organic light emitting diode as claimed in claim 1 wherein
    a majority of the discrete light extraction waveguide elements extend less than approximately 20 μm between the waveguide element termination points;
    the index of refraction of the light expulsion matrix $\eta(P)$ is at least approximately 0.2 less than the effective index of refraction of the superstructure waveguide $\eta_{\mathit{eff}}(O)$ and the effective index of refraction of the discrete light extraction waveguide elements $\eta_{\mathit{eff}}(WG)$;
    the thickness of the superstructure waveguide $x(O)$ and the combined thickness $x(WG+P)$ of the discrete light extraction waveguide elements and the light expulsion matrix differ by less than approximately 1.5 μm along a dimension perpendicular to the direction of optical propagation; and
    the superstructure waveguide is separated from the discrete light extraction waveguide elements by less than approximately 1.5 μm along a dimension perpendicular to the direction of optical propagation.

3. An organic light emitting diode as claimed in claim 2 wherein the respective effective indices of refraction of the superstructure waveguide $\eta_{\mathit{eff}}(O)$ and the discrete light extraction waveguide elements $\eta_{\mathit{eff}}(WG)$ differ by approximately 0.3 or less.

4. An organic light emitting diode as claimed in claim 3 wherein the respective indices of refraction of the light expulsion matrix $\eta(P)$ and the glass substrate $\eta(G)$ meet the limitation:

$|\eta(P)-\eta(G)|<0.2$.

5. An organic light emitting diode as claimed in claim 2 wherein the respective effective indices of refraction of the superstructure waveguide $\eta_{\mathit{eff}}(O)$ and the discrete light extraction waveguide elements $\eta_{\mathit{eff}}(WG)$ differ by approximately 0.2 or less.

6. An organic light emitting diode as claimed in claim 5 wherein the effective index of refraction of the superstructure waveguide $\eta_{\mathit{eff}}(O)$ is approximately $2.0 \geq \eta_{\mathit{eff}}(O) \geq 1.7$ and the effective index of refraction of the discrete light extraction waveguide elements $\eta_{\mathit{eff}}(WG)$ is approximately 1.7 or greater.

7. An organic light emitting diode as claimed in claim 2 wherein the effective index of refraction of the superstructure waveguide $\eta_{\mathit{eff}}(O)$, the effective index of refraction of the discrete light extraction waveguide elements $\eta_{\mathit{eff}}(WG)$, and the index of refraction of the light expulsion matrix $\eta(P)$ satisfy the following relations:

$1.6 \geq \eta(P) \geq 1.3$ $2.0 \geq \eta_{\mathit{eff}}(O) \geq 1.7$ $\eta_{\mathit{eff}}(WG) > 1.7$ $|\eta_{\mathit{eff}}(O) - \eta_{\mathit{eff}}(WG)| \leq 0.3$ $\eta_{\mathit{eff}}(O) - \eta(P) \geq 0.2$.

8. An organic light emitting diode as claimed in claim 2 wherein the effective index of refraction of the superstructure waveguide $\eta_{\mathit{eff}}(O)$, the effective index of refraction of the discrete light extraction waveguide elements $\eta_{\textit{eff}}(WG)$, and the index of refraction of the light expulsion matrix $\eta(P)$ satisfy the following relations:

$$1.6 \geq \eta(P) \geq 1.3$$

$$2.0 \geq \eta_{\textit{eff}}(O) \geq 1.7$$

$$\eta_{\textit{eff}}(WG) \geq 1.75$$

$$|\eta_{\textit{eff}}(O) - \eta_{\textit{eff}}(WG)| \leq 0.2$$

$$\eta_{\textit{eff}}(O) - \eta(P) \geq 0.25.$$

9. An organic light emitting diode as claimed in claim 2 wherein the effective index of refraction of the superstructure waveguide $\eta_{\textit{eff}}(O)$, the effective index of refraction of the discrete light extraction waveguide elements $\eta_{\textit{eff}}(WG)$, the index of refraction of the light expulsion matrix $\eta(P)$, and the index of refraction of the glass substrate $\eta(G)$ satisfy the following relations:

$$1.6 \geq \eta(P) \geq 1.3$$

$$2.0 \geq \eta_{\textit{eff}}(O) \geq 1.7$$

$$\eta_{\textit{eff}}(WG) > 1.7$$

$$1.6 \geq \eta(G) \geq 1.4$$

$$|\eta(P) - \eta(G)| < 0.2$$

$$|\eta_{\textit{eff}}(O) - \eta_{\textit{eff}}(WG)| \leq 0.3$$

$$\eta_{\textit{eff}}(O) - \eta(P) \geq 0.2.$$

10. An organic light emitting diode as claimed in claim 2 wherein the combined thickness x(WG+P) of the discrete light extraction waveguide elements and the light expulsion matrix is approximately 1.5 µm or less along a dimension perpendicular to the direction of optical propagation.

11. An organic light emitting diode as claimed in claim 10 wherein the discrete light extraction waveguide elements are separated from the superstructure waveguide by approximately 0.5 µm or less along a dimension perpendicular to the direction of optical propagation.

12. An organic light emitting diode as claimed in claim 10 wherein the diode superstructure-engaging side of the light extraction substructure is characterized by an RMS surface roughness of approximately 15 nm or less.

13. An organic light emitting diode as claimed in claim 2 wherein the thickness of the superstructure waveguide x(O) is approximately 1.0 µm or less along a dimension perpendicular to the direction of optical propagation.

14. An organic light emitting diode as claimed in claim 2 wherein the thickness of the superstructure waveguide x(O) is approximately 0.5 µm or less along a dimension perpendicular to the direction of optical propagation.

15. An organic light emitting diode as claimed in claim 2 wherein substantially all of the discrete light extraction waveguide elements extend less than 20 µm between waveguide element termination points along a direction of optical propagation defined by the superstructure waveguide.

16. An organic light emitting diode as claimed in claim 2 wherein the planarization layer is sufficiently thick for the diode superstructure-engaging side of the light extraction substructure to be characterized by an RMS surface roughness of approximately 15 nm or less and sufficiently thin to permit tunneling of light emitted from the diode superstructure to the discrete light extraction waveguide elements of the light extraction substructure.

17. An organic light emitting diode as claimed in claim 2 wherein the coupling length is a function of a distance separating the superstructure waveguide and a selected one of the discrete waveguide elements of the light extraction substructure.

18. An organic light emitting diode as claimed in claim 2 wherein the linear extent of substantially all of the discrete light extraction waveguide elements between the waveguide element termination points is from about the coupling length to five times the coupling length.

19. An organic light emitting diode as claimed in claim 17 wherein:
the discrete light extraction waveguide elements are separated from the superstructure waveguide by approximately 0.5 µm or less along a dimension perpendicular to the direction of optical propagation;
the approximate coupling length is 20 µm or less; and
the linear extent of a majority of the discrete light extraction waveguide elements between the waveguide element termination points is approximately 20 µm or less.

20. An organic light emitting diode as claimed in claim 17 wherein:
the discrete light extraction waveguide elements are separated from the superstructure waveguide by approximately 0.3 µm or less along a dimension perpendicular to the direction of optical propagation;
the approximate coupling length is 10 µm or less; and
the linear extent of a majority of the discrete light extraction waveguide elements between the waveguide element termination points is approximately 10 µm or less.

21. An organic light emitting diode as claimed in claim 2 wherein a majority of the discrete light extraction waveguide elements extend from approximately 1 µm to approximately 20 µm in length between waveguide element termination points along a direction of optical propagation defined by the superstructure waveguide.

22. An organic light emitting diode as claimed in claim 2 wherein the discrete light extraction waveguide elements are distributed over the waveguide surface of the glass substrate in a pseudo-random distribution controlled to an extent sufficient to ensure uniform distribution of the approximately 1 µm to approximately 20 µm discrete light extraction waveguide elements over the waveguide surface of the glass substrate.

23. An organic light emitting diode as claimed in claim 2 wherein substantially all of the discrete light extraction waveguide elements extend from approximately 1 µm to approximately 20 µm between waveguide element termination points along a direction of optical propagation defined by the superstructure waveguide.

24. An organic light emitting diode comprising a diode superstructure and a light extraction substructure, wherein:
the diode superstructure comprises a cathode, an anode, and an organic light emitting semiconductor material interposed between the cathode and the anode to collectively define a superstructure waveguide;
the light extraction substructure comprises a glass substrate, a plurality of discrete light extraction waveguide elements distributed over a waveguide surface of the glass substrate, and a light expulsion matrix distributed over the discrete light extraction waveguide elements and the waveguide surface of the glass substrate;
a majority of the discrete light extraction waveguide elements extend less than approximately 20 µm between waveguide element termination points along a direction of optical propagation defined by the superstructure waveguide;

the light expulsion matrix is distributed at varying thicknesses to enhance the planarity of a diode superstructure-engaging side of the light extraction substructure and to provide light expulsion sites at the waveguide element termination points of the discrete light extraction waveguide elements;

the index of refraction of the light expulsion matrix $\eta(P)$ is at least approximately 0.2 less than the effective index of refraction of the superstructure waveguide $\eta_{eff}(O)$ and the effective index of refraction of the discrete light extraction waveguide elements $\eta_{eff}(WG)$;

the respective effective indices of refraction of the superstructure waveguide $\eta_{eff}(O)$ and the discrete light extraction waveguide elements $\eta_{eff}(WG)$ differ by approximately 0.3 or less;

the thickness of the superstructure waveguide x(O) and the combined thickness x(WG+P) of the discrete light extraction waveguide elements and the light expulsion matrix differ by less than approximately 1.5 µm along a dimension perpendicular to the direction of optical propagation; and the superstructure waveguide is separated from the discrete light extraction waveguide elements by less than approximately 1.5 µm along a dimension perpendicular to the direction of optical propagation.

25. A display device incorporating one or more of the organic light emitting diodes of claim 1.

26. The display device of claim 25, wherein the organic light emitting diode comprises a white backlight.

27. A method of forming the organic light emitting diode of claim 1, comprising:
   a. forming discrete light extraction waveguide elements on a substrate;
   b. forming a light expulsion matrix on the discrete light extraction waveguide elements;
   c. forming a diode superstructure on the light expulsion material, wherein the diode superstructure comprises;
      i. a cathode;
      ii. an anode; and
      iii. an organic light emitting semiconductor material interposed between the cathode and the anode; and
   d. optionally, forming an encapsulating layer on the diode superstructure.

28. The method of claim 27, wherein the light expulsion layer is formed in air at a temperature below 300° C.

* * * * *